United States Patent
Bechevet et al.

(10) Patent No.: US 8,513,049 B2
(45) Date of Patent: Aug. 20, 2013

(54) METHOD FOR TEXTURING A PHOTOVOLTAIC CELL

(75) Inventors: Bernard Bechevet, Doucy (FR); Johann Jourdan, Chambery (FR); Sylvin De Magnienville, La Nouillerie (FR); Sébastien Thibert, Grenoble (FR); Nadège Reverdy-Bruas, Voreppe (FR); Didier Chaussy, Brié et Angonnes (FR); Davide Beneventi, Saint Martin d'Hères (FR)

(73) Assignee: MPO Energy, Averton (FR)

( * ) Notice: Subject to any disclaimer, the term of this patent is extended or adjusted under 35 U.S.C. 154(b) by 0 days.

(21) Appl. No.: 13/541,909

(22) Filed: Jul. 5, 2012

(65) Prior Publication Data

US 2013/0011956 A1 Jan. 10, 2013

(51) Int. Cl.
*H01L 21/00* (2006.01)

(52) U.S. Cl.
USPC ........................... 438/71; 438/65; 438/69

(58) Field of Classification Search
USPC ............................... 438/65, 69, 71, 72
See application file for complete search history.

(56) References Cited

U.S. PATENT DOCUMENTS

| | | | |
|---|---|---|---|
| 2010/0154862 A1* | 6/2010 | Schiavoni et al. | 136/246 |
| 2010/0159629 A1* | 6/2010 | Herner | 438/71 |
| 2011/0162688 A1* | 7/2011 | Petti | 438/68 |

FOREIGN PATENT DOCUMENTS

| | | |
|---|---|---|
| EP | 1801649 A2 | 6/2007 |
| FR | 2935842 A1 | 3/2010 |

OTHER PUBLICATIONS

Hauser H et al << *Nanoimprint lithography for solar cell texturisation*>> Proceedings of SPIE, Micro-Optics 2010, Apr. 12-16, 2010, Bruxelles, BE, vol. 7716, 2010, pp. 77160X-1-77160X-9, XP55024742, SPIE—The International Society for Optical Engineering, USA ISSN: 0277-786X, DOI : 10.1117/12.853897.

Watts M P C: << *Advances in Roll to Roll Processing of Optics*>> Proceedings of SPIE, Advanced Fabrication Technologies, for Micro/Nano Optics and Photonics, Jan. 21-23, 2008, San Jose, CA, USA, vol. 6883, 2008, pp. 688305-1-688305-11, XP040433781, SPIE—The International Society for Optical Engineering, USA ISSN : 0277-786X, DOI : 10.1117/12.762668.

\* cited by examiner

*Primary Examiner* — Kevin M Picardat
(74) *Attorney, Agent, or Firm* — Honigman Miller Schwartz and Cohn LLP

(57) ABSTRACT

A method for texturing an active surface of a photovoltaic cell in single-crystal silicon or poly-crystal silicon includes depositing a resin on the active surface of the cell, texturing the resin on the active surface with geometric patterns, and texturing the active surface of the cell by eliminating the deposited resin. The depositing of the resin is preceded by pre-texturing the resin on a depositing tool. The texturing step of the resin on the active surface is simultaneous with the depositing of the resin on the active surface.

5 Claims, 1 Drawing Sheet

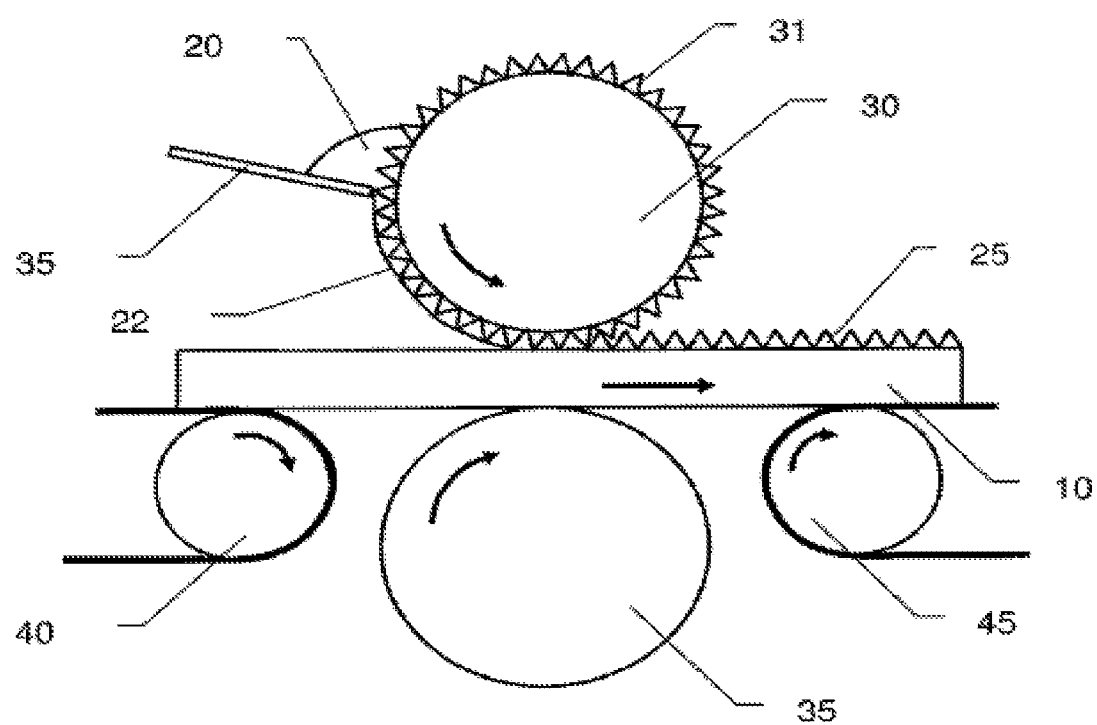

METHOD FOR TEXTURING A PHOTOVOLTAIC CELL

CROSS REFERENCE TO RELATED APPLICATIONS

This U.S. patent application claims priority under 35 U.S.C. §119 from French Application No. 11 56000, filed on Jul. 4, 2011, which is hereby incorporated by reference in its entirety.

TECHNICAL FIELD

The present disclosure generally concerns a photovoltaic cell intended to be mounted on a solar panel.

BACKGROUND

Said cells are known in the prior art, made either in single-crystal or poly-crystal silicon. One of the factors influencing the conversion yield of solar energy to electric energy is the absorption rate of solar energy. In other words, the reflectivity of the active surface must be as low as possible since the cell must absorb the most light possible. Conventionally, the active surfaces of the cells are geometrically textured to reduce reflection. This texturing is generally obtained in baths by chemical attack to cause erosion. The implementing of this chemical attack particularly has the disadvantage of using polluting liquids whose storage and recycling costs are high. In addition, with regard to cells in poly-crystal silicon, the reduction in the coefficient of reflection by chemical attack is limited since the texturing geometries obtained are random, which means that the yield is not significantly improved. This erosion can also be obtained by plasma attack, but again the texturing obtained is random with the result that the yield is not significantly improved whether for cells in single-crystal or poly-crystal silicon.

Document FR 2 935 842 presents a texturing method comprising the depositing of resin followed by texturing thereof and then the texturing of the cell using erosion to remove all the previously deposited resin, so that the texturing patterns of the resin are reproduced on the cell. Nevertheless, this method is not adapted to the production of photovoltaic cells under industrial conditions since the forming of the resin i.e. the texturing thereof is conducted after it has been deposited by means of a texturing mould. This mould applies a pressure on the cell and the controlling of forces is not guaranteed when using a method with high production rates, with the result that numerous cell breakages will occur since the very narrow thickness of the cells makes them fragile. It can be added that this point is essential given the increasingly lowering thickness of cells to economise on silicon. The application of the mould onto the cell also requires stops during the forward travel of the cells on the production line and the sequencing of production, thereby limiting productivity.

SUMMARY

The present disclosure provides a method for texturing a photovoltaic cell compatible with mass industrial production, without the risk of cell breakage with current cell thicknesses and compatible with future reductions in thickness.

For this purpose, one first aspect of the disclosure concerns a method for texturing an active surface of a photovoltaic cell comprising the steps of:
depositing a resin on an active surface of the cell,
texturing the resin on the active surface with geometric patterns,
texturing the active surface of the cell by eliminating the deposited resin;
where:
the step to deposit the resin is preceded by a pre-texturing step of the resin on a depositing tool, and in that
the texturing step of the resin on the active surface is simultaneous with the depositing step of the resin on the active surface.

The method increases the productivity of texturing by pre-texturing the resin at the time of its deposit on the depositing tool and by conducting final texturing of the resin simultaneously with the application thereof onto the active surface of the cell. A single operation on the cell (depositing and texturing), instead of two, provides for the simplification of equipment and savings in production time. The texturing of the resin and of the active surface during the removal of the resin avoids having recourse to liquid baths to apply a predefined texturing pattern onto the active surface, which considerably reduces the reflection coefficient of the treated cells both in single-crystal silicon or poly-crystal silicon.

The method is particularly well suited for rigid photovoltaic cells. These rigid cells are thin and brittle and the simultaneous application and texturing of the resin on the active surface avoids multiple steps of applying stresses on this type of cell.

Advantageously, the simultaneous steps of depositing and texturing the resin on the active surface apply forces onto the active surface of the photovoltaic cell and the method comprises a step of withstanding forces onto a surface opposite the active surface of the photovoltaic cell simultaneously with the steps of resin depositing and texturing. The cells are protected against the forces applied during the step of depositing and texturing the resin, by the simultaneous step of withstanding forces onto the opposite face of the cell. This method does not therefore create any stresses in the cell at the time of resin texturing, which offers the possibility of further reducing the thickness of the cells without any detriment to production equipment.

In one embodiment, the steps of depositing and texturing the resin onto the active surface are conducted using a flexography or offset printing process. These processes whereby resin is deposited by a roller coated with resin and etched with texturing patterns are fully suitable for the texturing of fragile, planar cells. In addition, the force transmission step can be integrated into this process by adding a counter-roller underneath the cells. The production rates are high and allow a reduction in production costs.

Advantageously, the simultaneous steps of depositing and texturing the resin on the active surface are conducted continuously with steps of feeding and evacuating the photovoltaic cells on a conveyor. The flexography process is a continuous process and the depositing and texturing steps using a drum are fully possible in-line with a conveyor, for high productivity.

Advantageously, the steps of feeding and evacuating the photovoltaic cells are carried out within the same plane. This embodiment ensures that no deflection or deformation will be imposed to the cells so as not to break them. It may be noted that the flexographic (conventionally used for flexible substrates in a roll to roll process) allows, through coplanar inlet and outlet, to deposit resin and texture it on rigid cells by limiting the deformation imposed to keep deformations within the elastic domain of these very rigid cells. In other words, the method according to the present invention comprises a limitation of the deformations imposed to the cells during depositing and texturing of the resin, so that these deformations are kept within the elastic range of cells in single-crystal silicon and poly-crystal silicon. Another solution is to limit the stress in cells in single-crystal silicon and poly-crystal silicon so that these constraints do not exceed the limit of elastic resistance of the material.

A second aspect of the disclosure is a photovoltaic cell fabricated using a method according to the first aspect of the disclosure.

A third aspect of the disclosure is a solar panel comprising at least one photovoltaic cell according to the second aspect of the disclosure.

A last aspect of the disclosure is manufacturing equipment capable of implementing the method according to the first aspect of the invention and comprising a tool for depositing resin on the active surface of a photovoltaic cell, where the resin depositing tool comprises means for pre-texturing the resin when it is deposited on the depositing tool, and in that the depositing tool is capable of texturing the resin at the time of its deposit on the active surface of the photovoltaic cell.

Advantageously, the depositing tool is a flexography or offset printing roller.

The details of one or more implementations of the disclosure are set forth in the accompanying drawings and the description below. Other aspects, features, and advantages will be apparent from the description and drawings, and from the claims.

DESCRIPTION OF DRAWINGS

FIG. 1 illustrates a photovoltaic cell at the time it is coated with resin.

DETAILED DESCRIPTION

FIG. 1 shows a photovoltaic cell 10 brought by a feed conveyor 40 towards a flexography station. This flexography station comprises a printing roller 30 and a counter-pressure roller 35. The printing roller 30 deposits resin 20 on a surface of the cell 10. The printing roller comprises geometric patterns 31 which pre-texture the resin on the printing roller, after it has been coated by a knife 35. The resin 20 is therefore pre-textured with patterns 22. When the resin is deposited on the cell 10, it is textured to its final form 25 and is evacuated by the conveyor 45. The resin can then be cross-linked either by UV or heating before being removed to obtain texturing of the active surface of the cell itself. The patterns 31 of the printing roller may be pyramids for example so that the patterns 25 cause adequate texturing of the active surface to reduce the reflection coefficient thereof.

The method allows the use of flexography to coat and texture cells in single-crystal silicon or poly-crystal silicon without breaking them. Flexography is conventionally used for flexible substrates which have a Young's modulus less than 10 GPa and tolerate high elastic deformation. Limitation of deflections and deformations with coplanar conveyors 40 and 45 allows simultaneous coating and texturing of photovoltaic cells without breaking them, even if they have a Young's modulus of about 130 to 170 GPa, depending on the crystal direction.

It will be appreciated that various modifications and/or improvements obvious to persons skilled in the art can be made to the different embodiments of the invention described in the present description without departing from the scope of the invention defined by the appended claims. In particular, reference is made to a flexography or offset printing process, but any printing process using a printing roller and pressure counter-roller may be contemplated.

The invention claimed is:

1. A method for texturing an active surface of a photovoltaic cell in single-crystal silicon or poly-crystal silicon, the method comprising:
   depositing a resin on the active surface of the cell;
   texturing the resin on the active surface with geometric patterns;
   texturing the active surface of the cell by eliminating the deposited resin;
   wherein the depositing of the resin is preceded by pre-texturing the resin on a depositing tool; and wherein:
   wherein the texturing of the resin on the active surface is simultaneous with the depositing of the resin on the active surface.

2. The texturing method of claim 1, wherein the simultaneous depositing and texturing of the resin on the active surface apply forces onto the active surface of the photovoltaic cell, the texturing method further comprising withstanding forces onto a surface opposite the active surface of the photovoltaic cell, simultaneously with the depositing and texturing of the resin.

3. The texturing method of claim 1, wherein the depositing and texturing of the resin on the active surface are performed using a flexography or offset printing process.

4. The texturing method of claim 3, wherein the simultaneous depositing and texturing of the resin on the active surface are conducted continuously with the feeding and evacuating photovoltaic cells performed by a conveyor.

5. The texturing method of claim 3, wherein the feeding and evacuating the photovoltaic cells are arranged within a same plane.

* * * * *